US012700849B2

(12) United States Patent
Abbott et al.

(10) Patent No.: US 12,700,849 B2
(45) Date of Patent: Aug. 4, 2026

(54) METHOD FOR PERFORMING A LAYOUT OF A BULK ACOUSTIC WAVE FILTER

(71) Applicant: SKYWORKS SOLUTIONS, INC., Irvine, CA (US)

(72) Inventors: Benjamin Paul Abbott, Irvine, CA (US); Mats Erik Fredriksson, Newbury Park, CA (US); Alexandre Augusto Shirakawa, Cardiff by the Sea, CA (US); David Albert Feld, Los Altos, CA (US); Jiansong Liu, Fremont, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 164 days.

(21) Appl. No.: 18/597,235

(22) Filed: Mar. 6, 2024

(65) Prior Publication Data

US 2024/0305272 A1     Sep. 12, 2024

Related U.S. Application Data

(60) Provisional application No. 63/450,466, filed on Mar. 7, 2023.

(51) Int. Cl.
| | |
|---|---|
| *H03H 9/56* | (2006.01) |
| *H03H 9/13* | (2006.01) |
| *H03H 9/17* | (2006.01) |

(52) U.S. Cl.
CPC .............. *H03H 9/56* (2013.01); *H03H 9/133* (2013.01); *H03H 9/17* (2013.01)

(58) Field of Classification Search
CPC ............ H03H 9/56; H03H 9/133; H03H 9/17; H03H 9/02118; H03H 9/605
USPC ................................................. 333/187, 188
See application file for complete search history.

(56) References Cited

U.S. PATENT DOCUMENTS

| | | | |
|---|---|---|---|
| 7,388,318 B2 * | 6/2008 | Yamada ................. | H03H 9/588 |
| | | | 310/365 |
| 2016/0126930 A1 * | 5/2016 | Zou ........................ | H10N 30/87 |
| | | | 333/187 |
| 2021/0119610 A1 * | 4/2021 | Kondo ................... | H03H 9/542 |

* cited by examiner

*Primary Examiner* — Jorge L Salazar, Jr.
(74) *Attorney, Agent, or Firm* — Lando & Anastasi, LLP

(57) ABSTRACT

Disclosed herein is a bulk acoustic wave filter comprising a number of acoustic wave resonators, each acoustic wave resonator being encompassed by a polygon including vertices of a mesh optimized to provide a reduced filter size of the bulk acoustic wave filter integrated on a die.

18 Claims, 11 Drawing Sheets

METHOD FOR PERFORMING A LAYOUT OF A BULK ACOUSTIC WAVE FILTER

CROSS-REFERENCE TO RELATED APPLICATIONS

This application claims priority under 35 U.S.C. § 119(e) to U.S. Provisional Patent Application Ser. No. 63/450,466, titled "METHOD FOR PERFORMING A LAYOUT OF A BULK ACOUSTIC WAVE FILTER," filed Mar. 7, 2023, the entire content of which is incorporated herein by reference for all purposes.

BACKGROUND

Technical Field

Aspects and embodiments of the present disclosure relate to acoustic wave devices and structures and methods for performing a layout of acoustic wave devices.

Description of Related Technology

Acoustic wave devices, in particular bulk acoustic wave (BAW) devices, can be utilized as components of filters in radio frequency electronic systems. For instance, filters in a radio frequency front-end of a mobile phone can include acoustic wave filters.

SUMMARY

In accordance with a first aspect of the present disclosure, there is provided a bulk acoustic wave (BAW) filter including acoustic wave resonators each encompassed by a polygon comprising vertices of a mesh optimized to provide a reduced filter size of a BAW filter integrated on a die.

In an example of the BAW filter, acoustic wave resonators comprise film bulk acoustic wave resonators.

In a further example of the BAW filter, each film bulk acoustic wave resonator includes a piezoelectric material sandwiched between a top electrode and a bottom electrode.

In a further example of the BAW filter according to the first aspect of the present disclosure, each film bulk acoustic wave resonator includes an excitable active area defined by an overlap of the top electrode and bottom electrode.

In a still further example of the BAW filter, the active area includes an active area boundary having an apodized shape with non-parallel polygon edges surrounded by an associated resonator keep-out area having a resonator keep-out boundary.

In another example of the BAW filter, the BAW filter has a ladder-type structure including series branch acoustic wave resonators and parallel branch acoustic wave resonators.

In a further example of the BAW filter, the BAW filter includes a signal input via, a signal output via and at least one common ground via.

In a further example of the BAW filter, each via of the BAW filter includes a via keep-out area surrounded by an associated via keep-out boundary.

In an example of the BAW filter, the acoustic wave resonators and the vias of the BAW filter are encompassed by a die keep-out boundary of the die defining an available die area of the respective die.

In a further example of the BAW filter, an unused residual area is calculated by subtracting the active areas and the keep-out areas of the film bulk acoustic wave resonators from the available die area of the respective die.

In a still further example of the BAW filter, the residual area is minimized to optimize the mesh.

In a still further example of the BAW filter, the polygon encompassing an associated acoustic wave resonator has a number of vertices to which a curvature is applied and which are connected through polygon edges forming a perimeter as the active area boundary of the respective acoustic wave resonator.

In a further example of the BAW filter, the resonator keep-out area of an acoustic wave resonator is calculated as a product of a length of the perimeter of the respective acoustic wave resonator and a predefined width.

In a still further example of the BAW filter, the vertices of the polygon encompassing an associated acoustic wave resonator are moved and/or are removed to eliminate parallel polygon edges of the polygon and to reduce the number of polygon edges of the polygon.

In a still further example of the BAW filter, the film bulk acoustic wave resonator is a membrane type film bulk acoustic wave resonator.

In a further alternative example of the BAW filter, the film bulk acoustic wave resonator is a mirror type film bulk acoustic wave resonator.

According to some aspects of the present disclosure, a radio frequency filter module comprises a bulk acoustic wave (BAW) filter including acoustic wave resonators each encompassed by a polygon comprising vertices of a mesh optimized to provide a reduced filter size of the BAW filter integrated on a die.

According to several aspects of the present disclosure, an electronic device comprises a radio frequency filter module with at least one bulk acoustic wave (BAW) filter including acoustic wave resonators each encompassed by a polygon comprising vertices of a mesh optimized to provide a reduced filter size of the BAW filter integrated on a die.

According to a number of aspects of the present disclosure, a method for performing a filter layout of a bulk acoustic wave (BAW) filter includes encompassing each of a plurality of acoustic wave resonators of the BAW filter by a polygon including vertices of a mesh optimized to provide a reduced filter size of the BAW filter integrated on a die.

In an example of the method, the vertices of the polygons encompassing the acoustic wave resonators of the bulk acoustic wave filter are added to an initial filter layout.

BRIEF DESCRIPTION OF THE DRAWINGS

Aspects and embodiments of this disclosure will now be described, by way of non-limiting example, with reference to the accompanying drawings.

DETAILED DESCRIPTION

Figure 1:
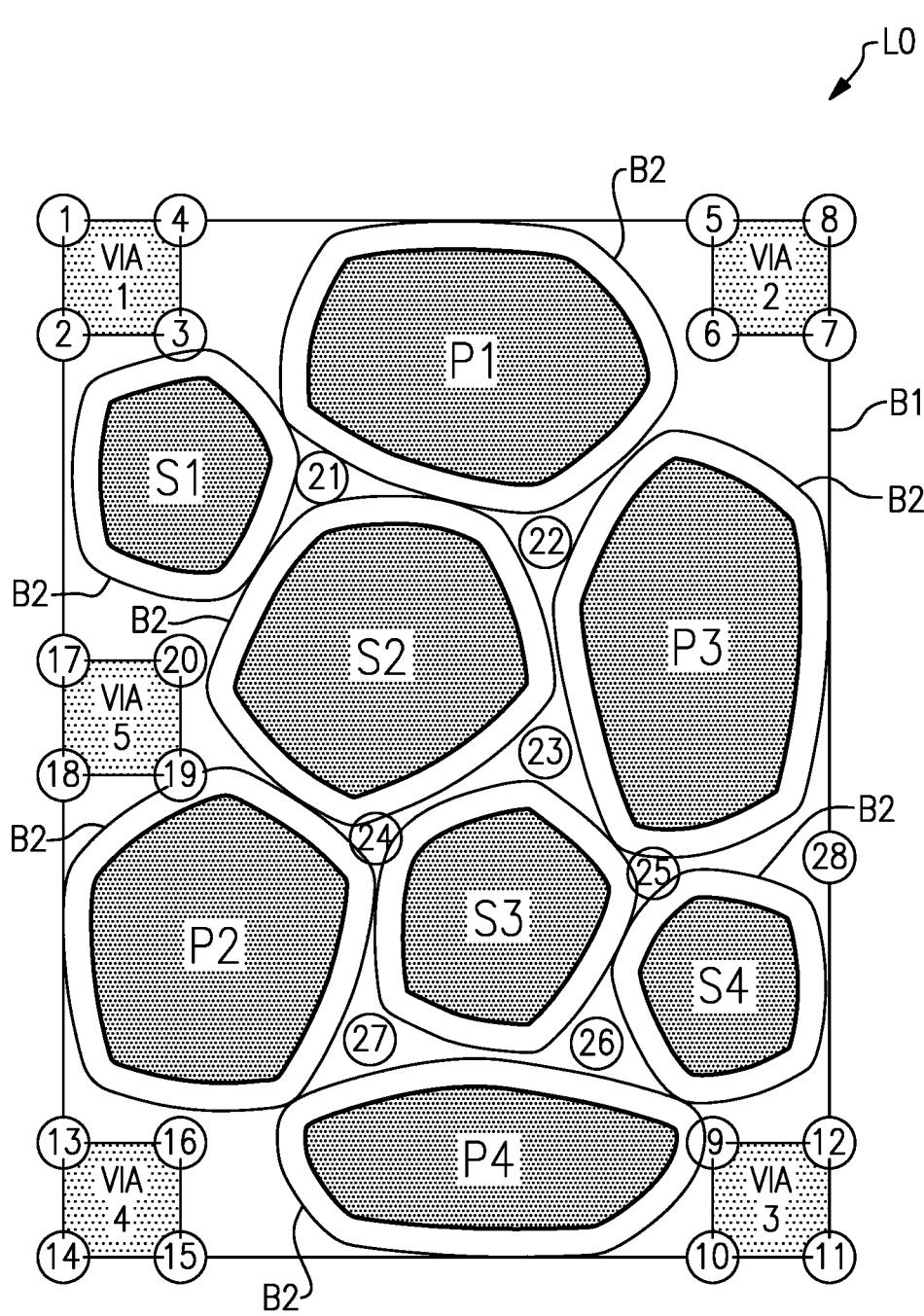
FIG. 1 shows a top view on an initial standard layout of a bulk acoustic wave filter used by a method for performing a filter layout of a bulk acoustic wave filter according to an embodiment of the present disclosure.

The following description of certain embodiments presents various descriptions of specific embodiments. However, the innovation described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of elements illustrated in a drawing. Further, some embodiments can incorporate any suitable combination of features from two or more drawings.

Bulk acoustic wave (BAW) filters operate by converting electrical energy into acoustic or mechanical energy on a piezoelectric material. BAW filters can make use of low loss electromechanical resonators to perform highly selective RF filtering. The layout of a BAW filter should be carefully designed. A BAW filter includes acoustic wave resonators. In a possible embodiment of the bulk acoustic wave filter according to the present disclosure, the acoustic wave resonators of the bulk acoustic wave filter comprise film bulk acoustic wave resonators FBARs.

FIG. 1 shows a top view of a BAW filter illustrating an initial standard layout L0 for manufacturing a BAW filter on a die. The BAW filter can comprise a ladder-type structure comprising series branch acoustic wave resonators S and parallel branch acoustic wave resonators P. In the exemplary standard layout illustrated in FIG. 1, the BAW filter comprises series branch acoustic wave resonators S1, S2, S3, S4 and parallel branch acoustic wave resonators P1, P2, P3, P4. FIG. 1 shows the active areas of the respective acoustic wave resonators S1 to S4 and P1 to P4 in cross-hatching. All acoustic wave resonators are integrated on a die. FIG. 1 further illustrates vias VIA 1 to VIA 5 including a signal input via (e.g. VIA 1), a signal output via (e.g. VIA 3) and three common ground (GND) vias (e.g. VIA 2, VIA 4, and VIA 5).

The active areas aAs of the series branch acoustic wave resonators S and the parallel branch acoustic wave resonators P are each defined by a corresponding active area boundary. The acoustic wave resonators S, P can be formed by film bulk acoustic wave resonators comprising a piezoelectric material sandwiched between a top electrode and a bottom electrode. The excitable active area aA of each acoustic wave resonator is defined by an overlap of the top electrode and the bottom electrode of the respective acoustic wave resonator.

As can be seen in FIG. 1, the acoustic wave resonators P, S and the vias of the BAW filter are encompassed by a die keep-out boundary B1 of the die defining the total available die area of the respective die. The active areas aAs of the acoustic wave resonators P, S are surrounded by corresponding resonator keep-out areas as illustrated in FIG. 1. Each resonator keep-out area surrounding an associated active area aA of an acoustic wave resonator comprises a resonator keep-out boundary B2. The keep-out boundaries B2 of the acoustic wave resonators integrated on the die can abut each other as illustrated in the standard layout of FIG. 1. The different serial branch acoustic wave resonators S and parallel branch acoustic wave resonators P of the ladder-structured BAW filter as defined by the standard layout of FIG. 1 can comprise different irregular shapes and active areas of different size.

Figure 2:
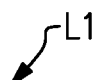
FIG. 2 illustrates a step of a possible embodiment of the method according to an embodiment of the present disclosure.

In one example, a method for performing a filter layout of a bulk acoustic wave filter including acoustic wave resonators may comprise several steps. In a first step of the layout method, vertices v are added to the initial standard layout L0 of FIG. 1 as illustrated in FIGS. 1 and 2 showing schematically twenty-eight vertices v. Vertices v of a mesh are provided on inside corners of each of the vias illustrated in FIG. 1.

The via geometry includes keep-out dimensions. Accordingly, the vias comprise via keep-out boundaries. Further, the acoustic wave resonators also comprise surrounding keep-out boundaries. Each acoustic wave resonator is encompassed by a polygon comprising vertices v of the mesh. Each polygon is defined by several vertices v connected by polygon edges. Accordingly, a mesh of vertices v is defined as illustrated in FIG. 2 defining an intermediary filter layout L1. The mesh M (v, c) comprises polygons defined by vertices v and edges c.

For instance, the parallel branch acoustic wave resonator P1 has an active area aA-P1 defined by six vertices v (v3, v4, v5, v6, v21, and v22) and the series branch acoustic wave resonator S3 has an active area aA-S3 defined by five vertices v (v23, v24, v25, v26, and v27). The number n of vertices v defining the active area of an acoustic wave resonator of the BAW filter can comprise at least three vertices v. The number n of vertices v of a polygon are connected by a corresponding number of edges e. For example, vertex v3 of the parallel branch acoustic wave resonator P1 is connected to vertex v21 of the parallel branch acoustic wave resonator P1 through edge e3-21 as illustrated in FIG. 2.

Figure 3:
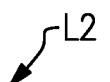
FIG. 3 illustrates a further possible step of a possible embodiment of the method according to an embodiment of the present disclosure.
Figure 3:
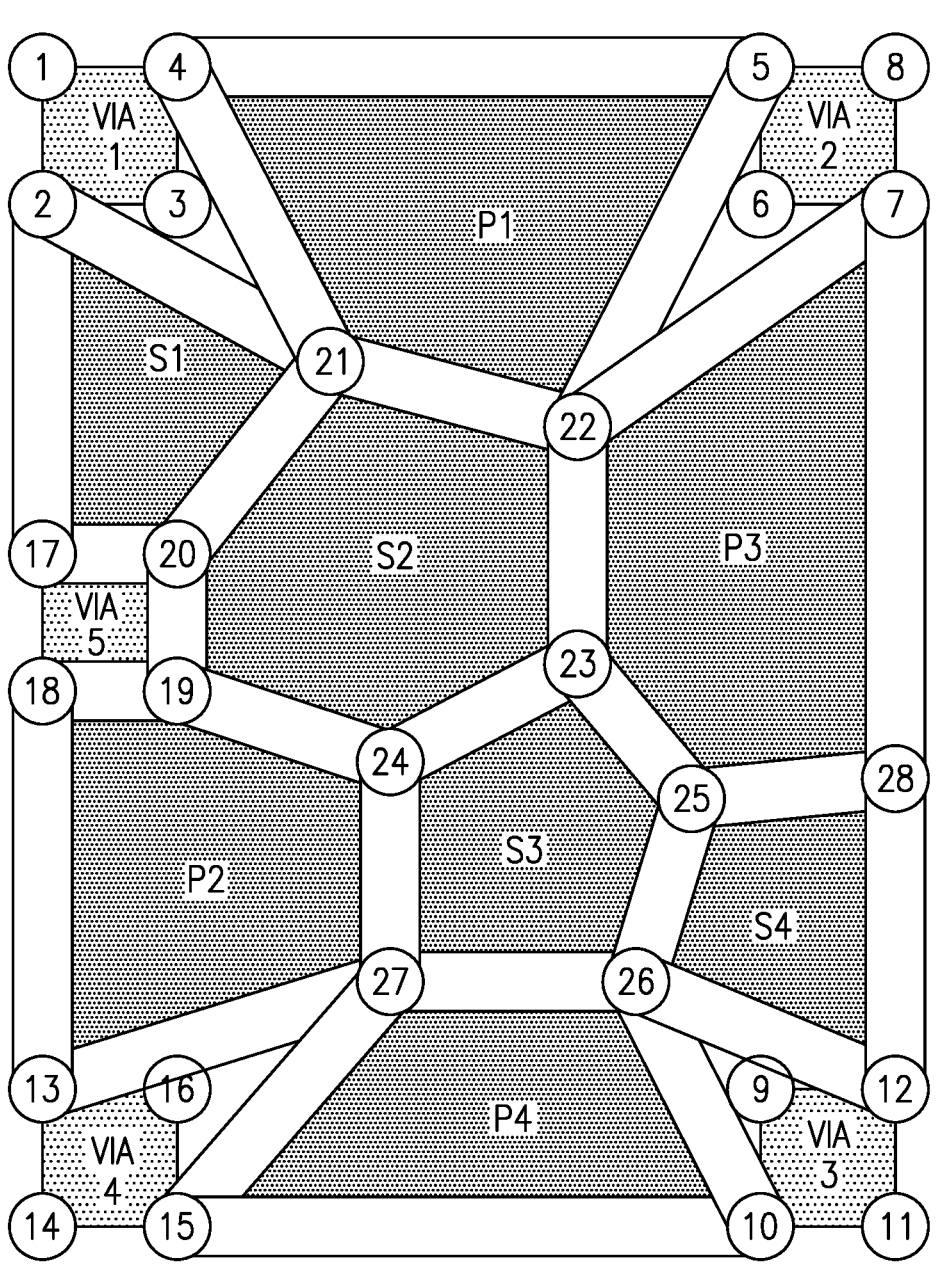

In a further step of the method as illustrated in FIG. 3, the vertices v are moved and/or removed to eliminate any parallel polygon edges of the polygons and to reduce the total number of polygon edges e of the polygons of the mesh M to provide an intermediary layout L2. Vertices v of the intermediary filter layout L1 shown in FIG. 2 can be trimmed to eliminate parallel sides and reduce the number of sides thus providing the intermediary filter layout L2 shown in FIG. 3. For example, the active area of the parallel branch acoustic wave resonator P1 which comprises in the initial intermediary layout L1 six vertices v as shown in FIG. 2 can be trimmed to get an active area polygon defined by four vertices v (v4, v5, v21, and v22) only. After rendering the mesh M of vertices v each polygon encompassing an associated acoustic wave resonator may comprise four or five polygon edges e as shown in FIG. 3. Two sides in a polygon may not be parallel after the rendering step leading to the filter layout L2 illustrated in FIG. 3.

Figure 4:
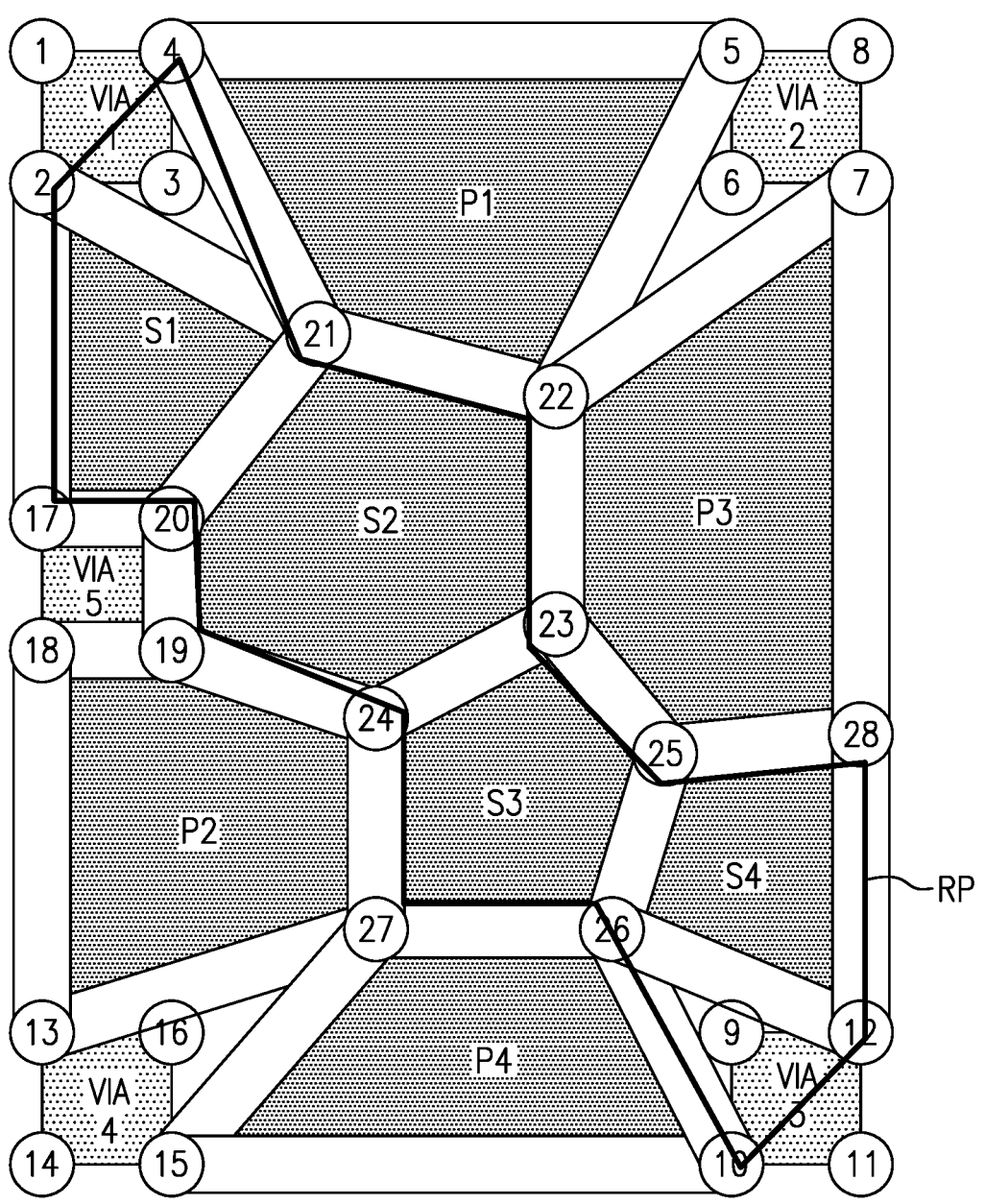
FIG. 4 illustrates a resistive path within the filter layout of a bulk acoustic wave filter designed using the method according to an embodiment of the present disclosure.

FIG. 4 illustrates a series resistance of a resistive path RP through the BAW filter. The resistive path RP comprises the series branch acoustic wave resonators S1, S2, S3, and S4 of the ladder-type structured BAW filter. The resistance between the signal input via (VIA1) and the signal output via (VIA3) can be determined and may form an additional optimization criterion. However, the main optimization criterion applied by the method according to the present disclosure is the reduction of the required size of the die.

The method optimizes the mesh M of vertices v to provide a reduced filter size of the BAW filter integrated on the die. The unused residual area of the die can be calculated by subtracting the active areas and the keep-out areas of the film bulk acoustic wave resonators from the total available die area of the die defined by the die boundary B1. An unused residual area can form an objective function of an optimization algorithm. The goal is to minimize the unused residual area. The calculated residual area is minimized in an optimization procedure by optimizing the respective mesh M of vertices v of the BAW filter layout.

Figure 6:
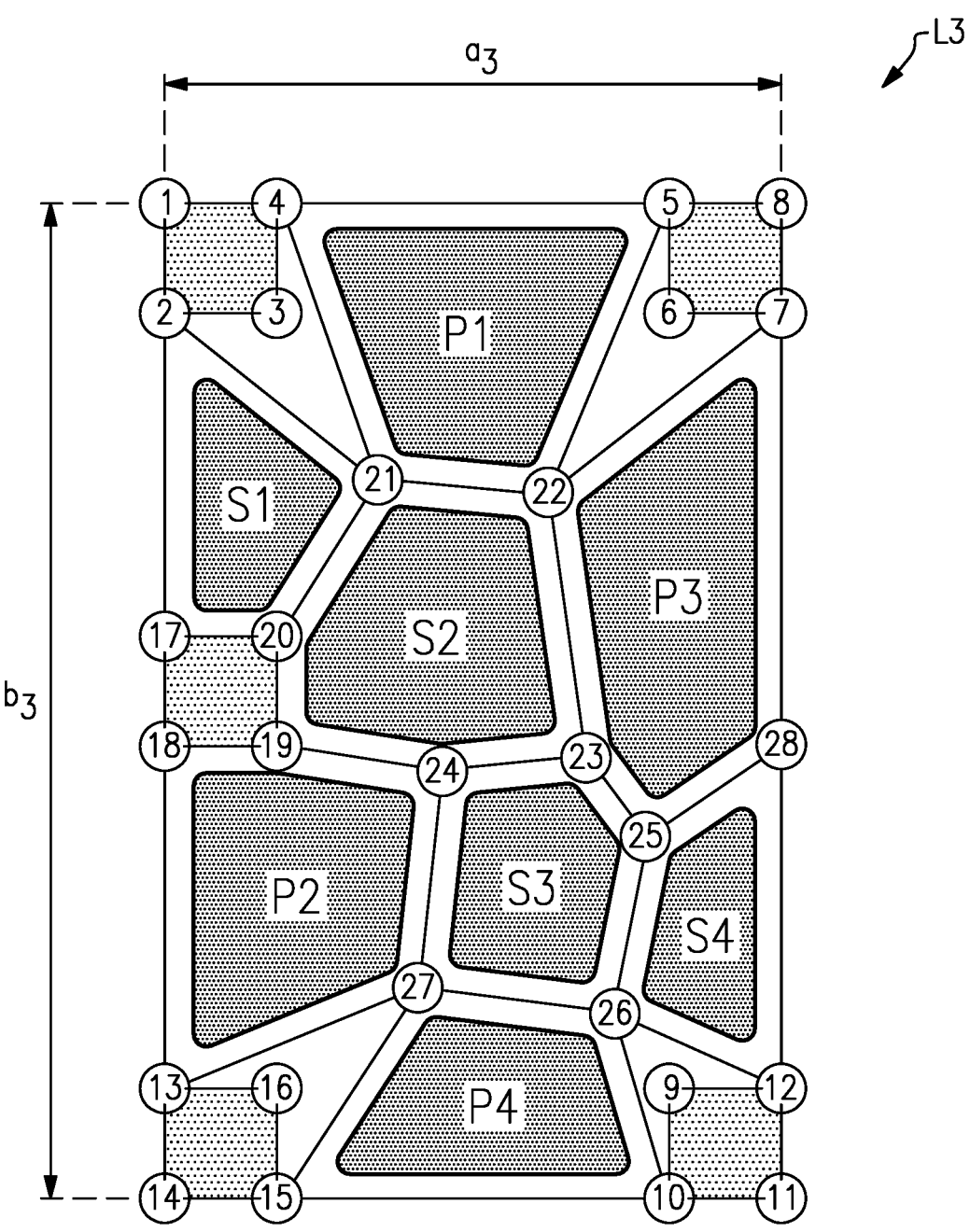

In one example, the rendered mesh structure illustrated in FIG. 3 is optimized to achieve a final filter layout L3 as illustrated in FIG. 6. In a further example, a curvature is applied for each corner of the optimized polygon as illustrated in FIG. 6.

Figure 5:
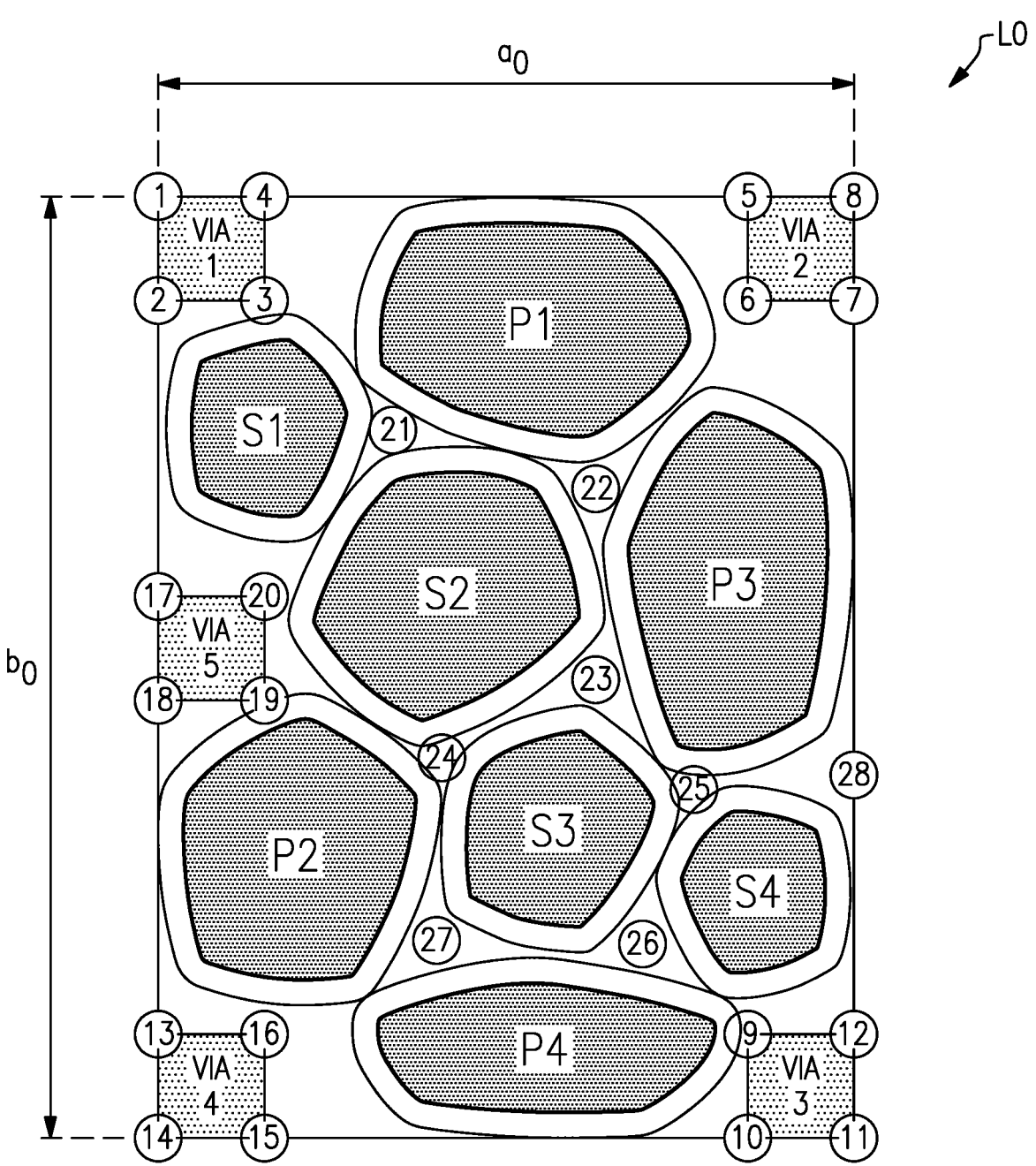
FIGS. 5 and 6 illustrate a final layout of the bulk acoustic wave filter achieved by performing a method according to the present disclosure in comparison to an initial filter layout to demonstrate a die size reduction achieved by the method according to an embodiment of the present disclosure.

FIGS. 5 and 6 illustrate the die size reduction achieved by performing the method according to aspects of the present disclosure. FIG. 5 illustrates the initial filter layout L0 of a BAW filter with a size of width a0 and length b0. FIG. 6 illustrates the final filter layout L3 of the same BAW filter after performing the layout method according to aspects of the present disclosure. The final filter layout L3 has a size with a width a3 and a length b3 when manufacturing the BAW filter on the die.

As can be seen from FIGS. 5 and 6, a significant die size reduction can be achieved. In one example, the die size can be reduced by more than 20%. Further, the width a0 of the filter layout L0 on the die for manufacturing the BAW filter can be significantly reduced as also illustrated in FIGS. 5 and 6.

In an example, the resonator keep-out area of an acoustic wave resonator can be calculated as a product of a length of the perimeter of the respective acoustic wave resonator and a predefined keep out width. The electrode overlap for the initial layout and the meshed layout after performing the method according to the present disclosure is identical for each acoustic wave resonator. The keep-out area can be uniformly applied as a perimeter of each acoustic wave resonator. By applying a curvature to the corners of the acoustic wave resonators as illustrated in FIG. 6, the effective keep-out area in the corners increases. This also allows the placement of release holes in the corners. Release holes can be used to release a membrane of a membrane type film acoustic wave resonator, e.g., by etching thought the release holes.

The method according to the present disclosure can be applied for different types of BAW filters including membrane type film bulk acoustic wave resonators or mirror type film bulk acoustic wave resonators.

Film bulk acoustic wave resonators are a form of BAW resonators that generally include a film of piezoelectric material sandwiched between a top electrode and a bottom electrode. The film of piezoelectric material can be suspended over a cavity that allows for the film of piezoelectric material to vibrate. The signal applied across the top and bottom electrodes causes an acoustic wave to be generated and travel through the film of piezoelectric material. A film bulk acoustic wave resonator can exhibit a frequency response to an applied signal with a resonance peak determined by a thickness of the film of piezoelectric material.

Ideally, the only acoustic wave that is generated in a film bulk acoustic wave resonator is a main acoustic wave that travels through the film of piezoelectric material in a direction perpendicular to layers of conducting material forming the top electrode and the bottom electrode. The piezoelectric material of a film bulk acoustic wave resonator, however, typically has a non-zero Poisson ratio. Compression and relaxation of piezoelectric material associated with a passage of the main acoustic wave may thus cause compression and relaxation of the piezoelectric material in a direction perpendicular to the direction of propagation of the main acoustic wave.

Compression and relaxation of the piezoelectric material in the direction perpendicular to the direction of propagation of the main acoustic wave may generate transverse acoustic waves that travel perpendicular to the main acoustic wave through the piezoelectric material. The transverse acoustic waves may be reflected back into an area in which the main acoustic wave propagates and may include spurious acoustic waves travelling in the same direction as the main acoustic wave.

Accordingly, the filter layout L3 achieved by the layout method according to embodiments of the present invention is such that spurious acoustic waves are suppressed. In an example, the BAW filter designed according to the layout method according to the present disclosure comprises active area boundaries with an apodized shape. The apodized shape is adapted to suppress the lateral spurious modes in the film bulk acoustic wave resonators. Apodization is based on utilizing a proper shape of the resonator top electrode which avoids edge points of the active area having the same lateral resonant path length. As can be seen in FIG. 6, the final filter layout L3 of the BAW filter designed according to the method according to the present disclosure has top electrodes with an apodized shape, i.e., with non-parallel edges of the active areas.

Figure 7:
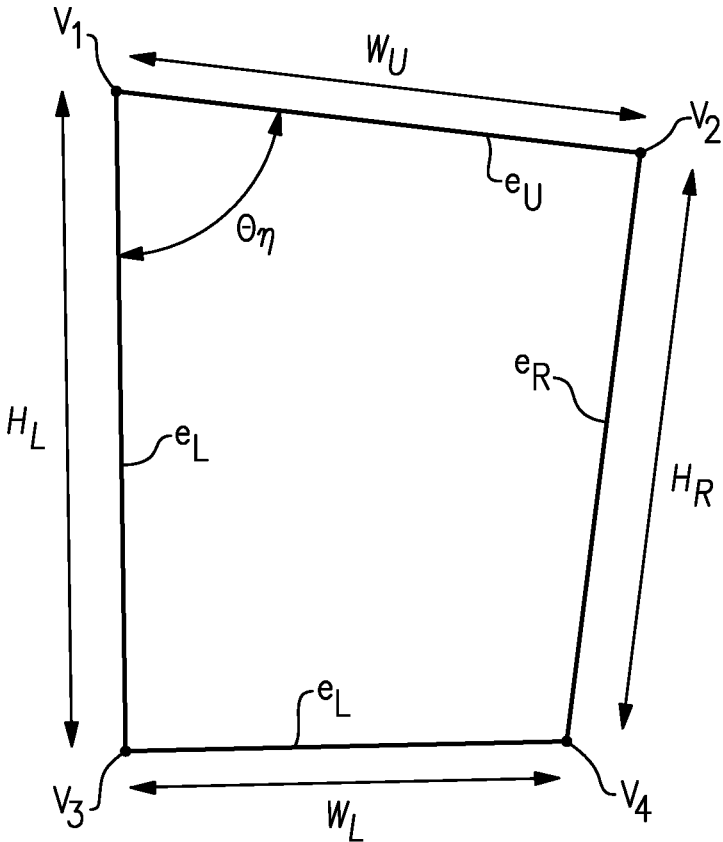
FIG. 7 illustrates an apodized shape of an active area boundary used in the method according to an embodiment of the present disclosure.

FIG. 7 shows schematically an active area aA defined by a top electrode of a film bulk acoustic wave resonator having an apodized shape defined by four vertices v1, v2, v3, and v4 connected through four edges e. The apodization can be defined by a defined apodization quantifier. Further, the inner angle Θ associated with a vertex v of a polygon can also be constrained.

Figure 8:
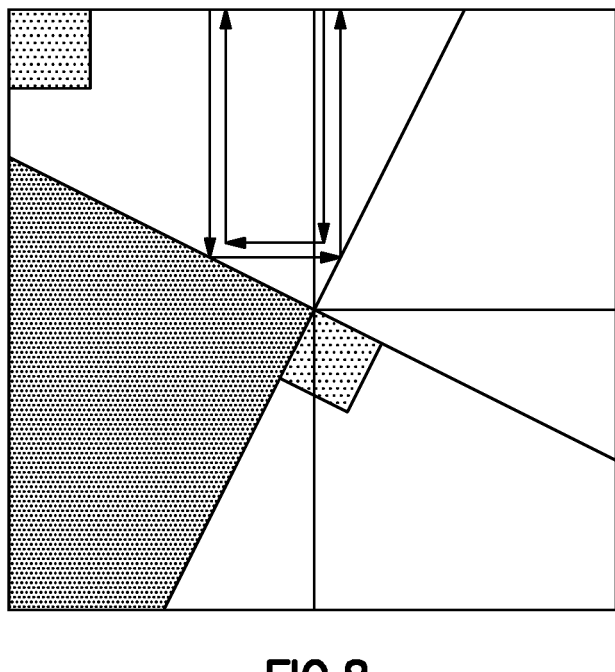
FIGS. 8 and 9 illustrate a possible implementation of the method according to an embodiment of the present disclosure.
Figure 9:
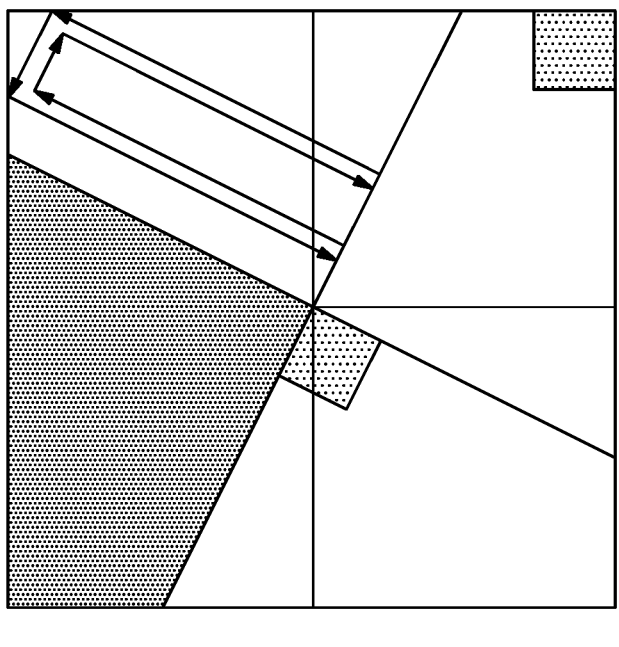

FIGS. 8 and 9 illustrate a further constraint which can be considered by the optimization process of the layout method according to the present disclosure. Since the polygons with 90 degree angles support lateral-mode resonance it is desirable to suppress these types of resonances in some implementations of the method according to the present disclosure as illustrated in FIGS. 8 and 9. The meshed polygons are optimized to avoid 90 degree angles at the vertices v to suppress lateral-mode resonances.

Figure 10:
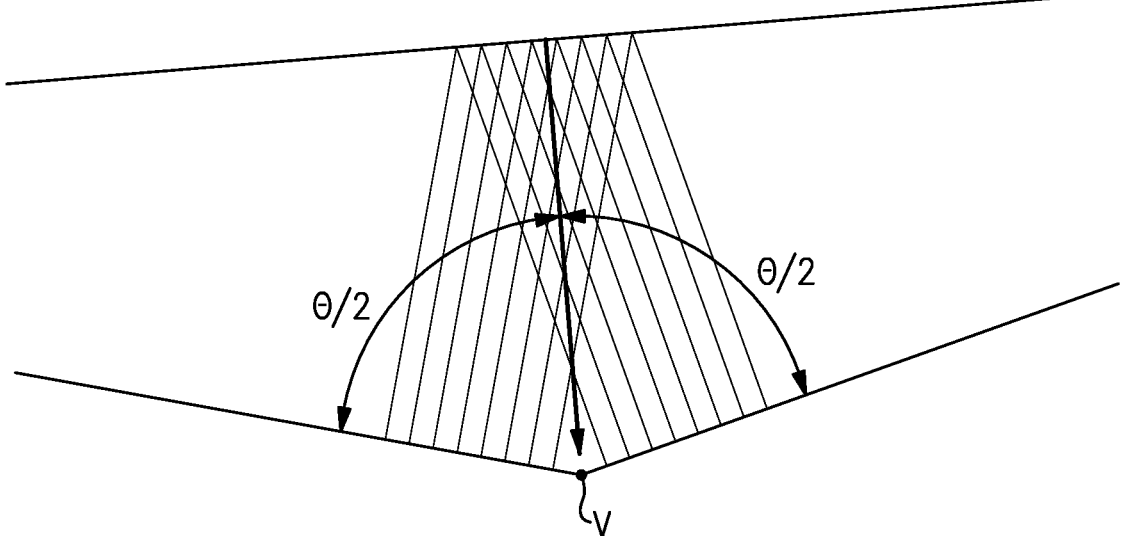
FIG. 10 illustrates a further possible implementation of the method according to an embodiment of the present disclosure.

FIG. 10 illustrates a further constraint considered by the optimization according to the layout method according to the present disclosure. As can be seen in FIG. 10, if a polygon basis normal vector is co-linear to a corner's bisection angle, lateral resonances may occur. When optimizing the mesh M of vertices v, these types of resonances may be avoided as well.

With the method according to embodiments of the present disclosure, a mesh M of vertices v is optimized to provide a reduced filter size of a BAW filter integrated on a die. The method may provide an optimized layout as illustrated in the example of FIG. 6. The meshing approach taken by the method according to the present disclosure eliminates unused space between the acoustic wave resonators while preserving a keep-out area utilized for DRC purposes. The mesh approach performed by the method according to the present disclosure preserves each element's neighbors. Thus, the electric connectivity of the acoustic wave resonators is not disturbed as the mesh M is adapted to improve filter performance of the BAW filter and reduce the required size of fabrication of the BAW filter on the die. The method minimizes the required size of the manufactured BAW filter on the die while maintaining a high performance of the BAW filter. The unused available area of the die is reduced.

The method can be performed automatically or semiautomatically starting from an initial filter layout L0 using a layout software tool showing a momentary intermediary filter layout by use of a graphical user interface (GUI). The tool may indicate the achieved size reduction of the designed BAW filter. Besides the size optimization criterion a user may select additional constraints considered by the tool when optimizing the filter layout L of the BAW filter. These constraints may include performance metrics of the filter performance or quantifiers such as a predefined or a user defined apodization quantifier.

The BAW filter designed and manufactured according to the method according to aspects of the present disclosure can be implemented in a variety of packaged modules. Some example packaged modules are discussed below in which any suitable principles and advantages of the packaged acoustic wave device discussed herein can be implemented.

Figure 11:
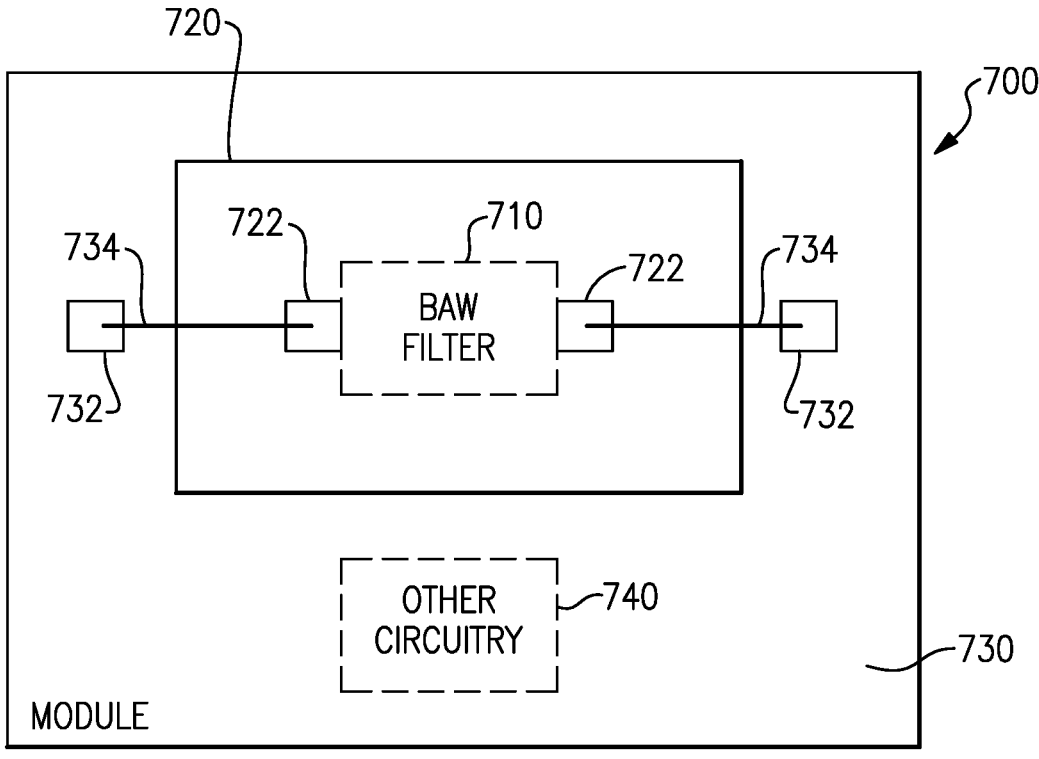
FIG. 11 illustrates a block diagram of an exemplary filter module which can include one or more bulk acoustic wave filters according to an embodiment of the present disclosure.
Figure 12:
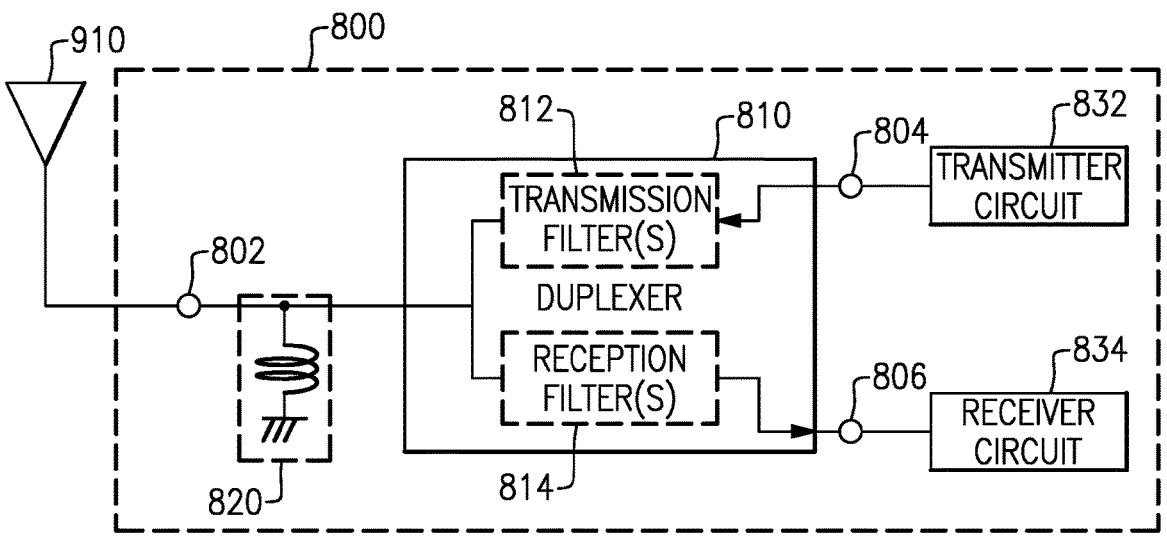
FIG. 12 shows a block diagram of an exemplary front-end module that can include one or more bulk acoustic wave filters according to an embodiment of the present disclosure.
Figure 13:
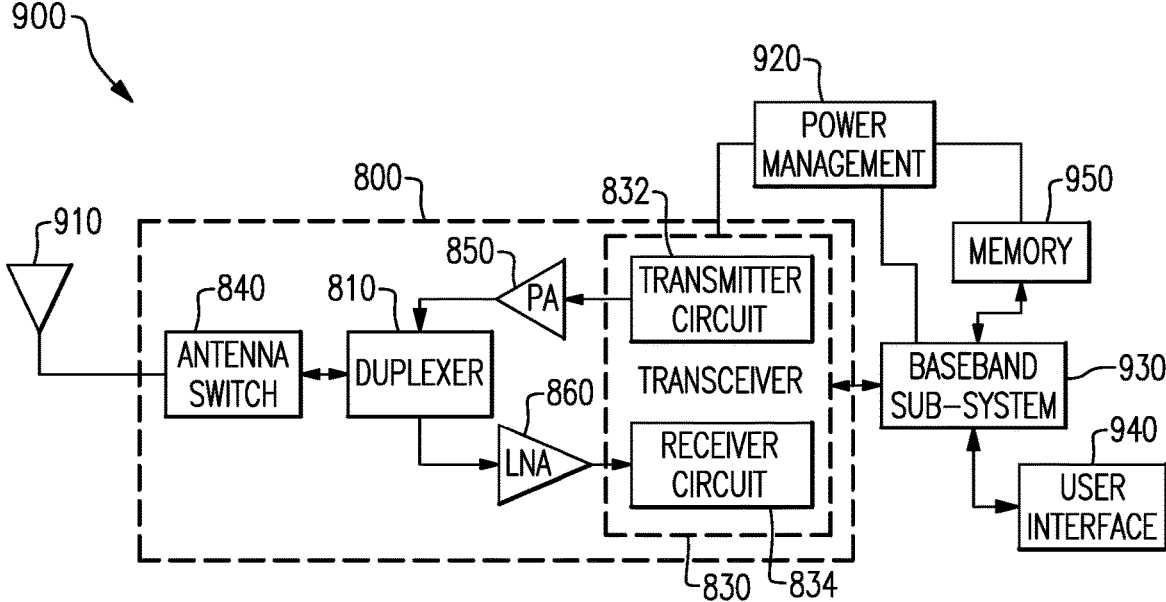
FIG. 13 shows a block diagram of an exemplary wireless device including the front-end module shown in FIG. 12.

FIGS. 11, 12, and 13 are schematic block diagrams of illustrative packaged modules and devices according to certain embodiments of the BAW filter according to the present disclosure.

A radio frequency filter module comprises a bulk acoustic wave filter including acoustic wave resonators each encompassed by a polygon comprising vertices v of a mesh M optimized to provide a reduced filter size for said bulk acoustic wave filter integrated on a die. The radio frequency module can form part of an electronic device.

An exemplary BAW filter 710 as shown in FIG. 11 has a filter layout L optimized by a method according to embodiments of the present disclosure.

The BAW filter 710 may include one or more film bulk acoustic wave resonators as disclosed herein. The BAW filter 710 may be implemented on one or more die(s) 720 including one or more connection pads 722. For example, the BAW filter 710 may include a connection pad 722 that corresponds to an input contact for the film bulk acoustic wave resonators and another connection pad 722 that corresponds to an output contact for the film bulk acoustic wave resonators. The packaged module 700 includes a packaging substrate 730 that is configured to receive a plurality of components, including the die 720.

A plurality of connection pads 732 can be disposed on the packaging substrate 730, and the various connection pads 722 of the film bulk acoustic wave resonator filter die 720 can be connected to the connection pads 732 on the packaging substrate 730 via electrical connectors 734, which can be solder bumps or wire bonds, for example, to allow for passing of various signals to and from the BAW filter 710.

The module 700 may optionally further include other circuitry die 740, for example, one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 12, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 12, however in other embodiments these components may be integrated into the same transceiver circuit or module. As will be appreciated by those skilled in the art, the front-end module 800 may include other components that are not illustrated in FIG. 12 including, but not limited to, switches, electromagnetic couplers, amplifiers, processors, and the like.

FIG. 13 is a block diagram of one example of a wireless device 900 including the antenna duplexer 810 shown in FIG. 12. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 12. The front-end module 800 includes the duplexer 810, as discussed above.

In the example shown in FIG. 13, the front-end module 800 further includes an antenna switch 840, which can be configured to switch between different frequency bands or modes, such as transmit and receive modes, for example. In the example illustrated in FIG. 13, the antenna switch 840 is positioned between the duplexer 810 and the antenna 910; however, in other examples the duplexer 810 can be positioned between the antenna switch 840 and the antenna 910.

In other examples, the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 12.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 800 may further include a low noise amplifier module 860, which amplifies received signals from the antenna 910 and provides the amplified signals to the receiver circuit 834 of the transceiver 830.

The wireless device 900 of FIG. 13 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user.

Any of the embodiments and examples described above can be implemented in association with mobile devices such as cellular handsets. The principles and advantages of the embodiments and examples can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHZ.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense, that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments or examples include, while other embodiments or examples do not include, certain features, elements and/or states. Thus, such conditional language is not generally intended to imply that features, elements and/or states are in any way required for one or more embodiments or examples or that one or more embodiments or examples necessarily include logic for deciding, with or without author input or prompting, whether these features, elements and/or states are included or are to be performed in any particular embodiment or example. While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave filter comprising:
a number of acoustic wave resonators, each acoustic wave resonator being encompassed by a polygon including vertices of a mesh optimized to provide a reduced filter size of the bulk acoustic wave filter integrated on a die;
a signal input via;
a signal output via; and
at least one common ground via, each of the signal input via, the signal output via, and the at least one common ground via including a via keep-out area surrounded by an associated via keep-out boundary.

2. The bulk acoustic wave filter of claim 1 wherein the acoustic wave resonators include film bulk acoustic wave resonators.

3. The bulk acoustic wave filter of claim 2 wherein each of the film bulk acoustic wave resonators includes a piezoelectric material sandwiched between a top electrode and a bottom electrode.

4. The bulk acoustic wave filter of claim 3 wherein each of the film bulk acoustic wave resonators includes an excitable active area defined by an overlap of the top electrode and bottom electrode.

5. The bulk acoustic wave filter of claim 4 wherein the active area includes an active area boundary having an apodized shape with non-parallel polygon edges surrounded by an associated resonator keep-out area having a resonator keep-out boundary.

6. The bulk acoustic wave filter of claim 2 wherein each of the film bulk acoustic wave resonators is a membrane type film bulk acoustic wave resonator.

7. The bulk acoustic wave filter of claim 2 wherein each of the film bulk acoustic wave resonators is a mirror type film bulk acoustic wave resonator.

8. The bulk acoustic wave filter of claim 1 having a ladder-type structure including series branch acoustic wave resonators and parallel branch acoustic wave resonators.

9. The bulk acoustic wave filter of claim 1 wherein the acoustic wave resonators and the vias of the bulk acoustic wave filter are encompassed by a die keep-out boundary of the die defining an available die area of the die.

10. The bulk acoustic wave filter of claim 9 wherein an unused residual area is calculated by subtracting active areas and the keep-out areas of the acoustic wave resonators from the available die area of the die.

11. The bulk acoustic wave filter of claim 10 wherein the residual area is minimized to optimize the mesh.

12. The bulk acoustic wave filter of claim 1 wherein the polygon encompassing an associated acoustic wave resonator includes a number n of vertices to which a curvature is applied and which are connected through polygon edges forming a perimeter as an active area boundary of the respective acoustic wave resonator.

13. The bulk acoustic wave filter of claim 12 wherein a resonator keep-out area of an acoustic wave resonator is calculated as a product of a length of the perimeter of the respective acoustic wave resonator and a predefined width.

14. The bulk acoustic wave filter of claim 12 wherein the vertices of the polygon encompassing an associated acoustic wave resonator are moved or removed to eliminate parallel polygon edges of the polygon and to reduce the number of polygon edges of the polygon.

15. A method for performing a filter layout of a bulk acoustic wave filter, the method comprising:
encompassing each of a number of acoustic wave resonators by a polygon including vertices of a mesh optimized to provide a reduced filter size of the bulk acoustic wave filter integrated on a die; and
forming a signal input via of the bulk acoustic wave filter, a signal output via of the bulk acoustic wave filter, and at least one common ground via of the bulk acoustic wave filter, each of the signal input via, the signal output via, and the at least one common ground via including a via keep-out area surrounded by an associated via keep-out boundary.

16. The method for performing a filter layout of a bulk acoustic wave filter of claim 15 wherein the vertices of the polygons encompassing the acoustic wave resonators of the bulk acoustic wave filter are added to an initial filter layout.

17. A radio frequency filter module comprising a bulk acoustic wave filter including acoustic wave resonators each encompassed by a polygon comprising vertices of a mesh optimized to provide a reduced filter size of the bulk acoustic wave filter integrated on a die, a signal input via, a signal output via, and at least one common ground via, each of the signal input via, the signal output via, and the at least one common ground via including a via keep-out area surrounded by an associated via keep-out boundary.

18. An electronic device comprising the radio frequency filter module of claim 17.

* * * * *